(12) United States Patent
Kwon et al.

(10) Patent No.: US 7,354,813 B2
(45) Date of Patent: Apr. 8, 2008

(54) METHOD FOR ELECTROSTATIC DISCHARGE PROTECTION IN INTEGRATED CIRCUITS

(75) Inventors: Gue-Hyung Kwon, Kyunggi-do (KR); Eun-Kyoung Kwon, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 329 days.

(21) Appl. No.: 11/142,486

(22) Filed: Jun. 1, 2005

(65) Prior Publication Data

US 2005/0205928 A1    Sep. 22, 2005

Related U.S. Application Data

(62) Division of application No. 10/252,631, filed on Sep. 23, 2002, now Pat. No. 6,914,305.

(30) Foreign Application Priority Data

Sep. 27, 2001 (KR) ............................... 2001-59954

(51) Int. Cl.
*H01L 21/8234* (2006.01)
(52) U.S. Cl. .................. 438/197; 438/199; 438/275
(58) Field of Classification Search ............... 438/197, 438/199, 275, 279, 283
See application file for complete search history.

(56) References Cited

U.S. PATENT DOCUMENTS

| 5,847,429 | A | 12/1998 | Lien et al. |
| 5,874,763 | A | 2/1999 | Ham |
| 5,930,094 | A | 7/1999 | Amerasekera et al. |
| 6,107,865 | A | 8/2000 | Brady |
| 6,184,557 | B1 * | 2/2001 | Poplevine et al. ........... 257/358 |
| 6,444,511 | B1 * | 9/2002 | Wu et al. .................... 438/199 |

(Continued)

FOREIGN PATENT DOCUMENTS

| EP | 1 087 441 A2 | 3/2001 |
| GB | 2 306 770 A | 5/1997 |
| JP | 1205560 A | 8/1989 |

OTHER PUBLICATIONS

Office Action for corresponding German patent application No. 102 45 770.0-33; Sep. 12, 2005.

(Continued)

*Primary Examiner*—Tuan H. Nguyen
(74) *Attorney, Agent, or Firm*—Myers Bigel Sibley & Sajovec

(57) ABSTRACT

An output circuit of an integrated circuit device includes first and second MOS transistors including respective spaced apart pairs of source and drain regions in a substrate, arranged such that respective first and second channels of the first and second MOS transistors are laterally displaced with respect to one another. The output circuit further includes an isolation region in the substrate, disposed between the first and second MOS transistors. A first conductor connects the source region of the first MOS transistor to a power supply node. A second conductor connects the drain region of the first MOS transistor to the source region of the second MOS transistor. A third conductor connects the drain region of the second MOS transistor to an external signal pad of the integrated circuit device. The isolation region may comprise first and second insulation regions surrounding respective ones of the first and second MOS transistors, and a guard ring surrounding and separating the insulation regions.

7 Claims, 14 Drawing Sheets

U.S. PATENT DOCUMENTS

| | | |
|---|---|---|
| 6,559,508 B1 | 5/2003 | Lin et al. |
| 6,570,226 B1 | 5/2003 | Groeseneken et al. |
| 2002/0074603 A1* | 6/2002 | Lin .......................... 257/355 |
| 2003/0058027 A1 | 3/2003 | Kwon et al. |
| 2003/0213999 A1 | 11/2003 | Lee et al. |

OTHER PUBLICATIONS

Anderson et al. "ESD protection for mixed-voltage I/O using NMOS transistors stacked in a cascode configuration" *Microelectronics Reliability* 39: 1521-1529 91999).

* cited by examiner

METHOD FOR ELECTROSTATIC DISCHARGE PROTECTION IN INTEGRATED CIRCUITS

RELATED APPLICATIONS

The present application is a divisional of U.S. application Ser. No. 10/252,631 filed on Sep. 23, 2002 now U.S. Pat. No. 6,914,305, which claims priority to Korean Patent Application No. 2001-59954, filed on Sep. 27, 2001, the contents of which are hereby incorporated by reference in their entirety.

FIELD OF THE INVENTION

The present invention relates to integrated circuit devices, more particularly, to circuits and methods for protecting integrated circuits from electrostatic discharge.

BACKGROUND OF THE INVENTION

A thrust of integrated circuit design has been the development of integrated circuits capable of higher frequency operation and/or lower power consumption. The ability of an integrated circuit to operate at high frequencies with low power consumption is generally determined by characteristics of active and passive elements in the integrated circuit, such as resistance and parasitic capacitance.

Referring to FIGS. 1A, 1B, and 1C, in order to reduce the drain and source resistances Rd, Rs of an NMOS transistor 10' or a PMOS transistor 10'', silicide layers SA comprising a low-resistance metallic material and silicon are formed on surfaces of a polysilicon gate GP, a source S, and a drain D using a self-aligned silicidation (hereinafter "salicidation") process. In applying the salicidation process, a discharge space for the transistor is defined at a region A at a junction disposed under a spacer GS adjacent the polysilicon gate GP. When electrical transients arising from electrostatic discharge (ESD) or electrical overstress (EOS) occur at a pad (not shown) connected to one of the source S or the drain D, the discharge space A may not be sufficiently large enough to prevent physical damage.

Input/output circuits are commonly designed to protect internal portions of an integrated circuit from transients arising from ESD, EOS, peak voltage, current surge, or noise. They also commonly provide voltage conversion between the voltage used by the internal portions and the voltage used by externally connected circuits, e.g., conversion of signals from CMOS to TTL or from TTL to CMOS. Input/output circuits also often include transistors with larger channel widths that can support higher currents which may arise from resistance, inductance, and capacitance of a printed circuit board (PCB) on which the integrated circuit is mounted and cables connecting the integrated circuit to external systems.

For example, a structure, as shown in FIG. 2A, that includes multiple transistors including a plurality of polysilicon gate layers 3 formed on a diffusion region 1 including source and drain regions S, D may be used. As can be seen in the cross-section in FIG. 2B, the substrate P-sub and the source and drain regions S, D form parasitic horizontal NPN bipolar transistors Q1, Q2 that provide a discharge path. Resistances between the bases of the parasitic transistors Q1, Q2 can prevent simultaneous turn-on of the transistors Q1, Q2. Therefore, it may take a significantly long time for all of the transistors Q1, Q2 to be turned on to provide a discharge path in response to an electrical transient. In the structure illustrated, the turn-on time of all the bipolar transistors Q1, Q2 is generally dependent upon values of on-resistance determined by dimensions of overlapped regions between the polysilicon gates 3 and the drains D.

However, as described above, a relatively small on-resistance may be provided by a transistor fabricated by a salicidation process, which may provide insufficient RC delay time to enable a desired level of conduction of the transistors Q1, Q2. This can result in insufficient ESD protection.

A protection circuit, such as a diode or silicon-controlled rectifier (SCR), may be used to provide ESD protection for an output drive circuit that includes MOS transistors produced by a salicidation process. It is generally desirable to provide a protection circuit capable of driving a large current at a relative low voltage, as it is generally desirable that the protection circuit discharge excessive transients before the MOS transistors of the output drive circuit exhibit break down. However, it may be difficult to provide a protection circuit with high current capability at a relatively low turn-on voltage.

One way of dealing with this problem is to raise the turn-on voltage of the output drive circuit. For example, turn-on voltage may be raised by increasing a base width of a parasitic LNPN bipolar transistor associated with a MOS transistor of a drive circuit. However, increasing the base width of a parasitic LNPN associated with an output drive circuit MOS transistor can result in a need to increase circuit area to compensate for lower current drivability.

FIG. 3 illustrates another way to increase the turn-on voltage of an output circuit 100 including a PMOS transistor 101 and an NMOS transistor 102 that drive an external signal pad PAD and are protected by a protection circuit 20. As shown, turn-on voltage of the NMOS transistor 102 may be increased by placing a resistor Rs in series with the NMOS transistor 102. This can restrain activation of a parasitic LNPN, but, as with extending base width, can lead to increased circuit area to offset weak current drivability due to the additional resistor.

Another technique to protect a breakdown of an NMOS transistor by raising a turn-on voltage of an output circuit beyond that of a protection circuit is shown in FIGS. 4A-4F. In particular, a base width of a parasitic LNPN can be extended by connecting NMOS transistors of an output circuit 110 and a protection circuit 120 in series.

Two ways of connecting the transistors are shown in FIGS. 4B-4C and FIGS. 4D-4E, respectively. Referring to FIGS. 4B and 4C, active regions of two NMOS transistors N1 and N2 are separated, and a source of the NMOS transistor N1 is connected by a metal line M to a drain of the NMOS transistor N2, which is grounded. FIGS. 4D and 4E show a configuration where the source of the NMOS transistor N1 and the drain of the NMOS transistor N2 are connected through an active region, which can more efficiently use circuit area.

Although the configurations shown in FIGS. 4B-4E can extend a base width between a drain connected to a pad PAD (i.e., a collector of the parasitic LNPN) and a source connected to the ground voltage Vss (i.e., an emitter of the parasitic LNPN), these configurations may not provide a desirable current gain because of presence of a parasitic bipolar transistor Q3 having an extended base width (see FIG. 4F). This can lead to poor ESD protection.

Other techniques for improving ESD protection for a salicidation MOS transistor are shown FIGS. 5A, 5B, 6A and 6B. In FIG. 5A, after forming N+ source and drain regions S, D in a substrate P-sub by means of an ion implantation, a part of an insulation film 41 formed on top spaces of the polysilicon gate layer GP and source/drain regions is removed. An opening 42 is then formed, exposing parts of the gate layer GP and the source and drain regions S, D. After a local salicidation using the insulation film as a mask, silicide films 44 are formed on the exposed surfaces of the gate layer and the source/drain regions S, D as shown in FIG. 5B. The configuration shown in FIGS. 5A and 5B can provide base width extension, but may be difficult and/or expensive to manufacture and may not provide desirable high frequency operation due to increased parasitic resistance.

Referring to FIGS. 6A and 6B, an NMOS transistor is fabricated by forming source and drain regions S, D in a substrate P-sub forming extended diffusion regions S' and D' under the source and drain regions S and D by means of a high-energy ion implantation, and then performing a salicidation process. Although the double-diffused salicidation transistor shown in FIG. 6B may have a wider discharge space due to the use of the deep-extended diffusion regions S' and D', the transistor may exhibit increased resistance and may require additional process steps for its fabrication. In addition, such a transistor may not have desirable ESD protection.

SUMMARY OF THE INVENTION

According to some embodiments of the present invention, an output circuit of an integrated circuit device includes first and second MOS transistors including respective spaced apart pairs of source and drain regions in a substrate, arranged such that respective first and second channels of the first and second MOS transistors are laterally displaced with respect to one another. The output circuit further includes an isolation region in the substrate, disposed between the first and second MOS transistors. A first conductor connects the source region of the first MOS transistor to a power supply node. A second conductor connects the drain region of the first MOS transistor to the source region of the second MOS transistor. A third conductor connects the drain region of the second MOS transistor to an external signal pad of the integrated circuit device.

In some embodiments, a surface of the source region of the first MOS transistor that faces the drain region of the second MOS transistor is smaller than a surface of the source region of the first MOS transistor that faces the drain region of the first MOS transistor. The isolation region may comprise at least one insulating region in the substrate, disposed between the first and second active regions. The isolation region may further comprise a guard region having a higher degree of the same conductivity type of the substrate, disposed between the first and second active regions and connected to the power supply node.

In further embodiments of the present invention, an output circuit includes a first MOS transistor comprising a first source region in a substrate, a first drain region in the substrate, and a first gate electrode disposed therebetween that controls a channel extending between the first source region and the first drain region. The output circuit further includes a second MOS transistor comprising a second source region in the substrate, a second drain region in the substrate, and a second gate electrode disposed therebetween that controls a channel extending between the second source region and the second drain region, arranged such that the first drain region and the second drain region are angularly disposed at first and second angles with respect to the first source region. An isolation region is disposed in the substrate, between the second drain region and the first source region. A first conductor connects the first source region to a power supply node A second conductor connects the first drain region of the first MOS transistor to the second source region. A third conductor connects the second drain region to an external signal pad of the integrated circuit device.

In still further embodiments of the present invention, an output circuit comprises an isolation region in a substrate surrounding first and second active regions in the substrate. The circuit further includes a first MOS transistor that comprises a plurality of source regions and a plurality of drain regions in the first active region and respective gate lines on the substrate between respective pairs of adjacent ones of the source and drain regions of the first MOS transistor, the source regions of the first MOS transistor connected to a power supply node. The circuit also includes a second MOS transistor comprising a plurality of source regions and a plurality of drain regions in the second active region and respective gate lines on the substrate between respective pairs of adjacent source and drain regions of the second MOS transistor, the drain regions of the first MOS transistor connected to the source regions of the second MOS transistor and the drain regions of the second MOS transistor connected to an external signal pad of the integrated circuit device.

The first and second active regions may be arranged in a parallel fashion such that the source regions of the first MOS transistor are positioned opposite the drain regions of the second MOS transistor and the drain regions of the first MOS transistor are positioned opposite the source regions of the second MOS transistor. The sides of the source and drain regions of the first MOS transistor that face the second MOS transistor may be narrower than adjacent sides of the source and drain regions of the first MOS transistor, and sides of the source and drain regions of the second MOS transistor that face the first MOS transistor may be narrower than adjacent sides of the source and drain regions of the second MOS transistor.

Related fabrication method embodiments are also described.

DETAILED DESCRIPTION

Figure 1A:
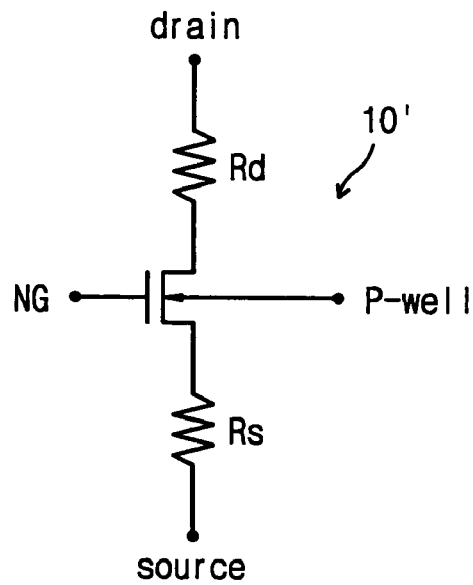
FIGS. 1A and 1B are equivalent circuit diagrams of NMOS and PMOS transistors.
Figure 1B:
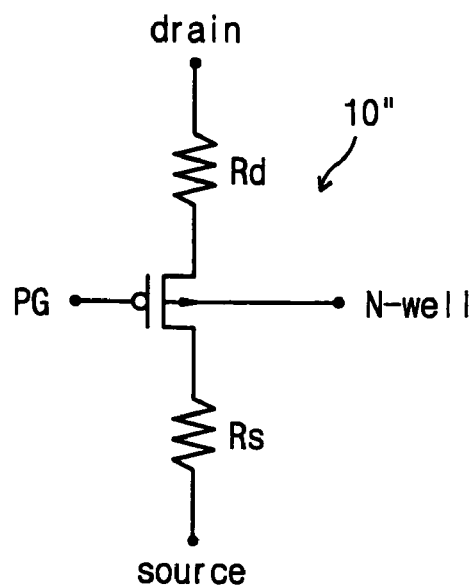
Figure 1C:
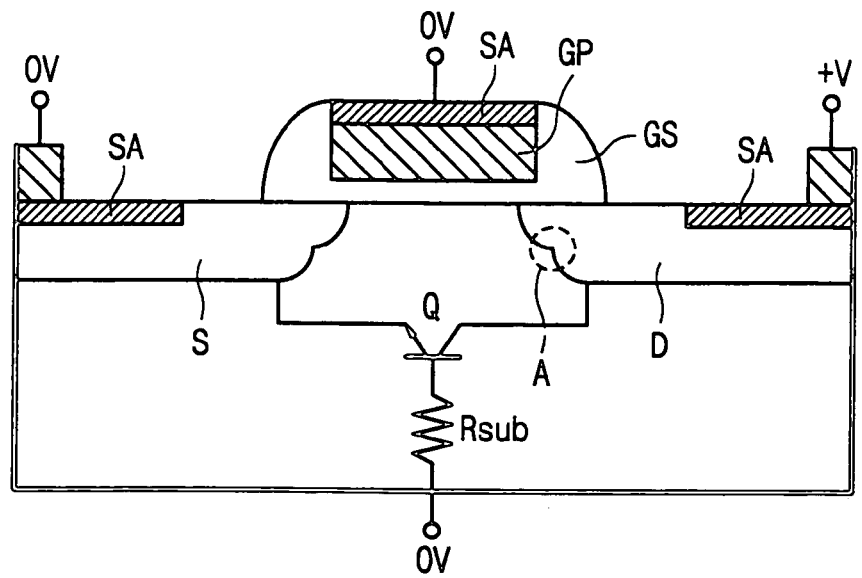
FIG. 1C is a sectional view of a MOS transistor fabricated by a salicidation process.
Figure 2A:
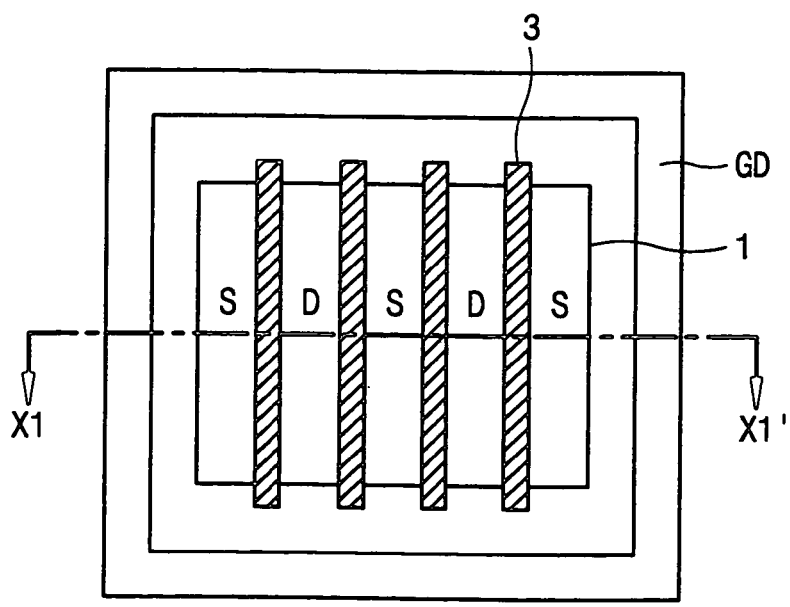
FIGS. 2A and 2B are planar and sectional view, respectively, of input/output transistors.
Figure 2B:
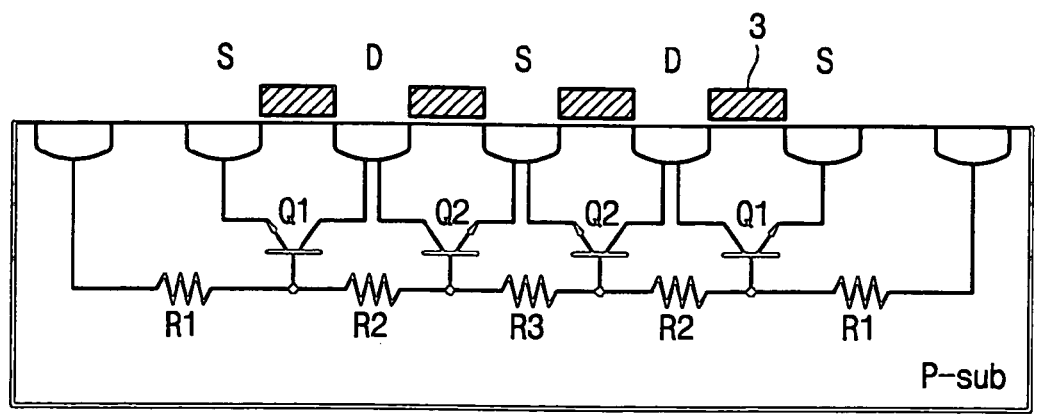
Figure 3:
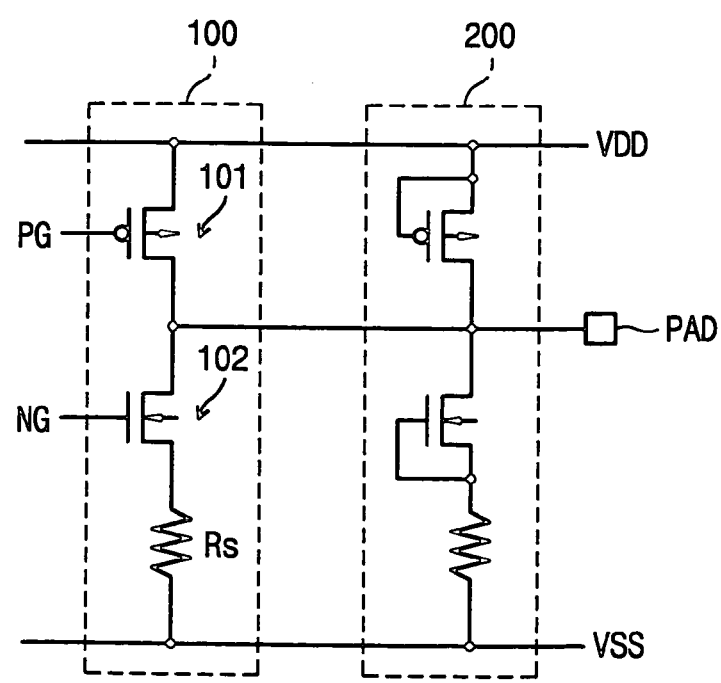
FIG. 3 is an equivalent circuit diagram of a conventional output circuit.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 7:
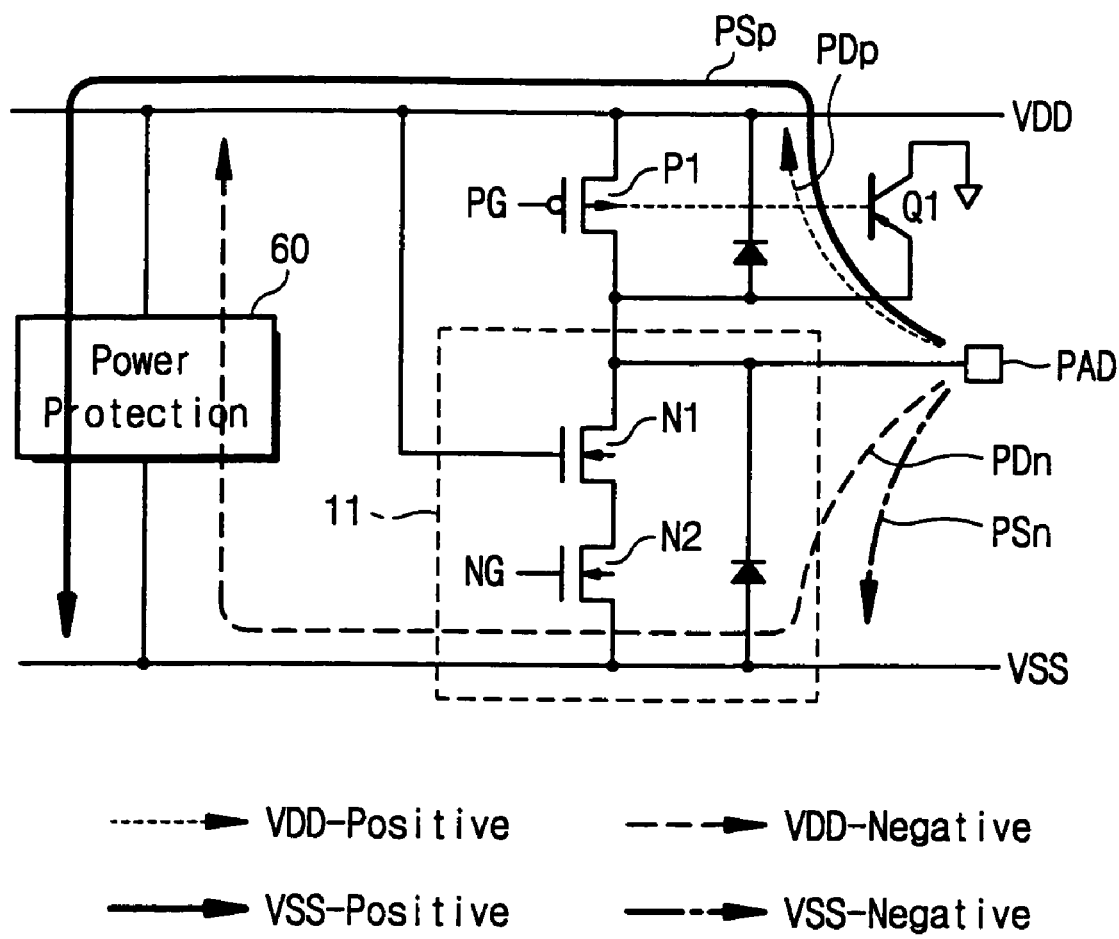
FIG. 7 is a circuit diagram of a protected output circuit according to some embodiments of the present invention.

FIG. 7 shows an output circuit 11 of an integrated circuit device 700 according to embodiments of the present invention, illustrating discharge paths between an external signal pad PAD of the integrated circuit 700 and a power supply voltage node VDD, and between the external signal pad PAD and a power supply ground voltage node VSS. The output circuit includes first and second NMOS transistors N1, N2 connected in series with a PMOS transistor P1 between a power supply voltage node VDD and a power supply ground node VSS. The output circuit is driven by signals PG, NG applied to respective gate electrodes of the PMOS transistor P1 and the NMOS transistor N2, which responsively drive the external signal pad PAD of the integrated circuit device 700.

When a positive transient voltage is present between the external signal pad PAD and the power supply voltage node VDD, the positive transient may be discharged to the power supply voltage node VDD through a discharge path PDp including a forward-biased P+/N junction at the source of the PMOS transistor P1. When a negative transient voltage is present between the signal pad PAD and the power supply voltage node VDD, the negative transient may be discharged through two paths, including a primary discharge path through a forward-biased N+/P junction between the drain of the NMOS transistor N1 and the substrate of the integrated circuit 700, and a secondary discharge path PDn through a power protection circuit 60 connected between the power supply voltage VDD and the ground voltage VSS.

When a positive transient voltage is present between the signal pad PAD and the power supply ground voltage node VSS, the positive transient may be discharged through two paths, including a primary discharge path through a forward-biased P+/N junction of the PMOS transistor P1, and a secondary discharge path PSp through the power protection circuit 60 (a discharge path PSp). When a negative voltage transient is present between the signal pad PAD and the power supply ground voltage node VSS, the negative transient may be discharged through a discharge path PSn including a forward-biased N+/P junction between the drain of the NMOS transistor N1 and the substrate.

Figure 8:
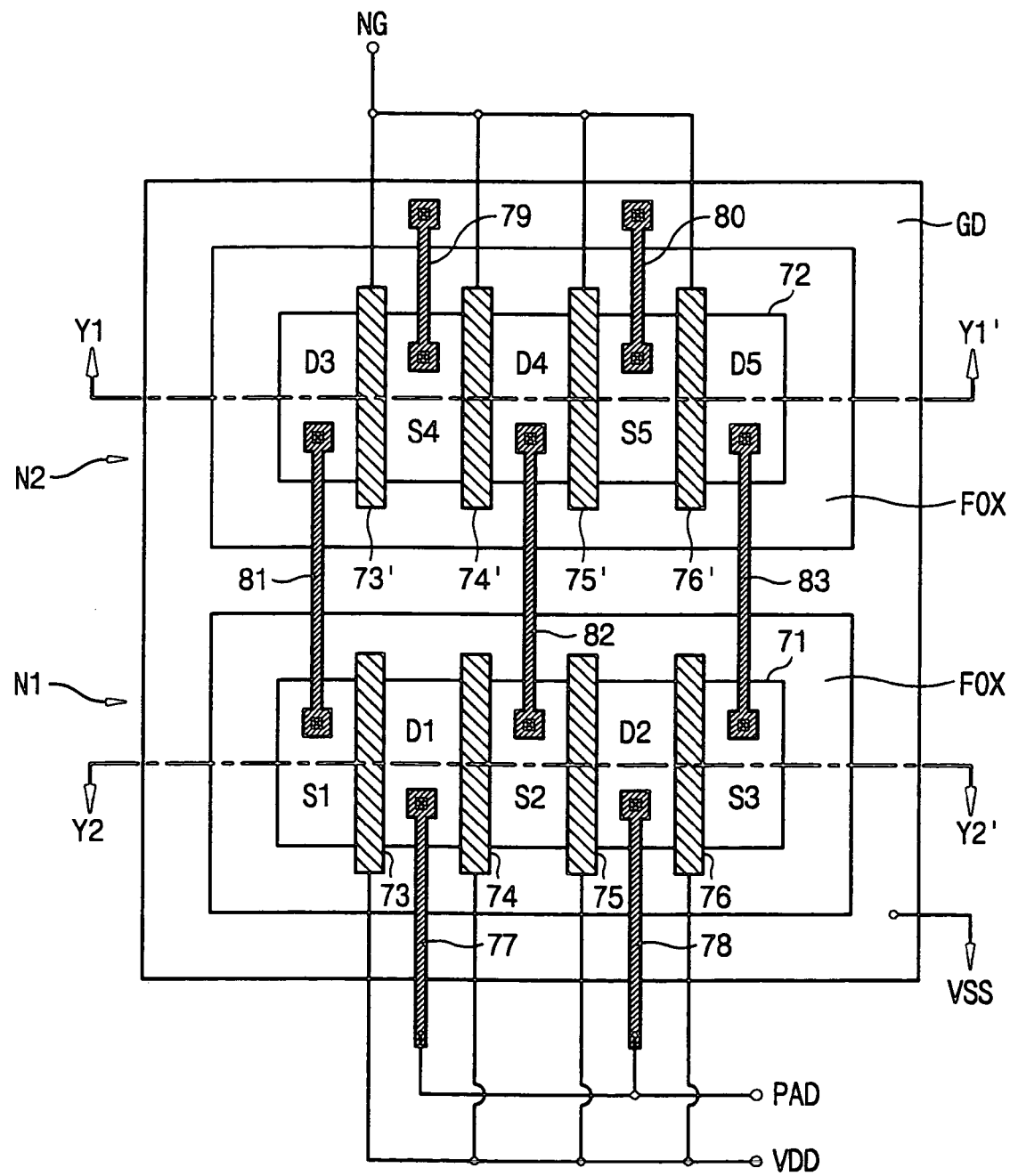
FIGS. 8 and 9 are planar and sectional views, respectively, of a configuration of a protected output circuit according to some embodiments of the present invention.
Figure 9:
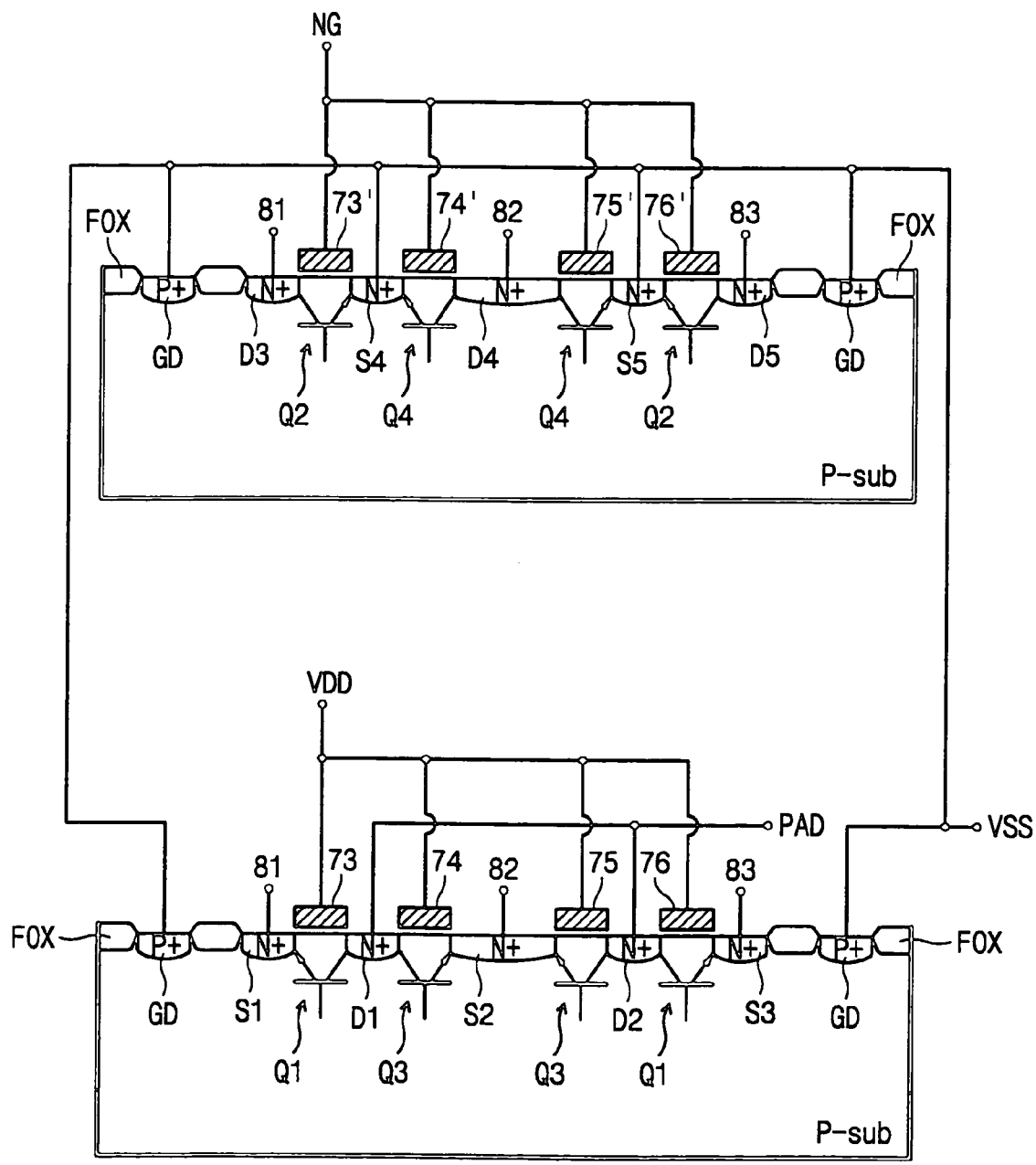

FIGS. 8 and 9 are plan and sectional views, respectively, of an output circuit according to embodiments the present invention. In particular, FIGS. 8 and 9 illustrate a configuration that may be used to implement the output circuit 11 of FIG. 7. FIG. 9 includes a section of the NMOS transistor N2, taken along a line Y1-Y1', and a section of the NMOS transistor N1, taken along a line Y2-Y2'.

Referring to FIGS. 8 and 9, NMOS transistors N1 and N2 are formed in first and second active regions 71, 72, which are separated from each other by first and second field oxide insulation regions FOX. The first active region 71 includes drain regions D1, D2, and source regions S1, S2, S3. Gate electrodes 73, 74, 75, 76 are disposed between adjacent source and drain regions. The second active region 72 includes drain regions D3, D4, D5 and source regions S4, S5, with gate electrodes 73', 74', 75', 76' disposed between adjacent source and drain regions. The drain regions D1, D2 of the NMOS transistor N1 are connected to an external signal pad PAD through conductive layers (or lines) 77, 78, and the source regions S4, S5 of the NMOS transistor N2 are connected to the power supply ground voltage node VSS through conductive layers (or lines) 79. The gate electrodes 73, 74, 75, 76 of the NMOS transistor N1 are connected to a power supply voltage node VDD, and the gate electrodes 73', 74', 75', 76' of the NMOS transistor N2 are connected to an input signal node NG. The gates of the NMOS transistors N1, N2 may be formed, for example, by a salicidation process.

The source regions S1, S2, S3 of the first NMOS transistor N1 are connected to the drain regions D3, D4, D5 of the second NMOS transistor 72 through conductive layers 81, 82, 83. Avoiding connection of these regions through a common diffusion region can help improve ESD protection. For the illustrated embodiments, smaller (narrower) faces of the source regions S1, S2, S3 of the first NMOS transistor N1 and the drain regions D3, D4, D5 of the second NMOS transistor N2 face one another, which can also reduce the effect of a parasitic NPN transistor associated with these structures. As shown, a P-type (P+) guard ring GD may surround the insulation regions FOX and may be connected the power supply ground node VSS. Such a P-type guard ring GD can further reduce the effect of the parasitic bipolar transistor, as the guard ring GD can decrease base modulation of the parasitic bipolar transistor.

As shown in FIG. 9, parasitic NPN bipolar transistors Q1, Q2, Q3, Q4 are associated with the transistors N1, N2. A base-emitter voltage of the parasitic transistor Q1 is VDD (Vin-0.6)-Vth, where Vth is a threshold voltage of the transistor N1. As the base to emitter voltage of the transistor Q1 is higher than a turn-on voltage of the parasitic NPN transistor, increasing base current for forward conduction may not cause the parasitic NPN bipolar transistor to be activated.

Figure 4A:
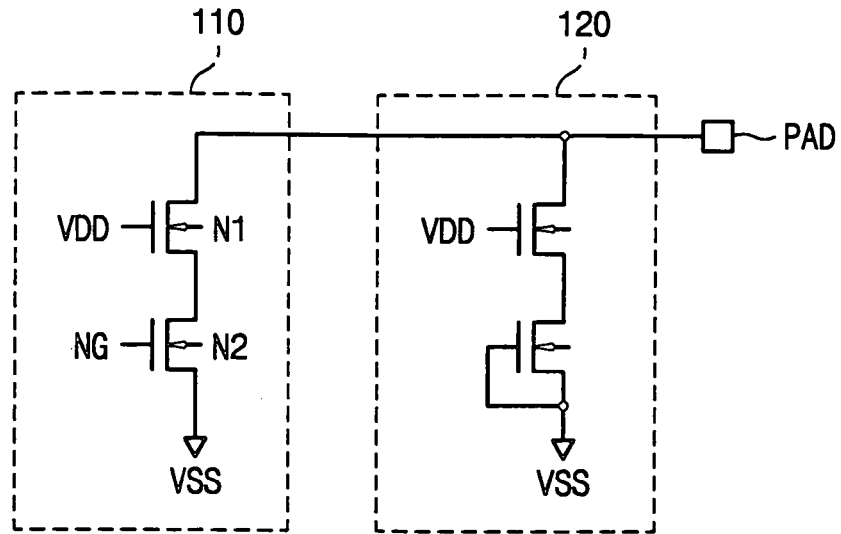
FIG. 4A is an equivalent circuit diagram of another conventional output circuit.
Figure 4B:
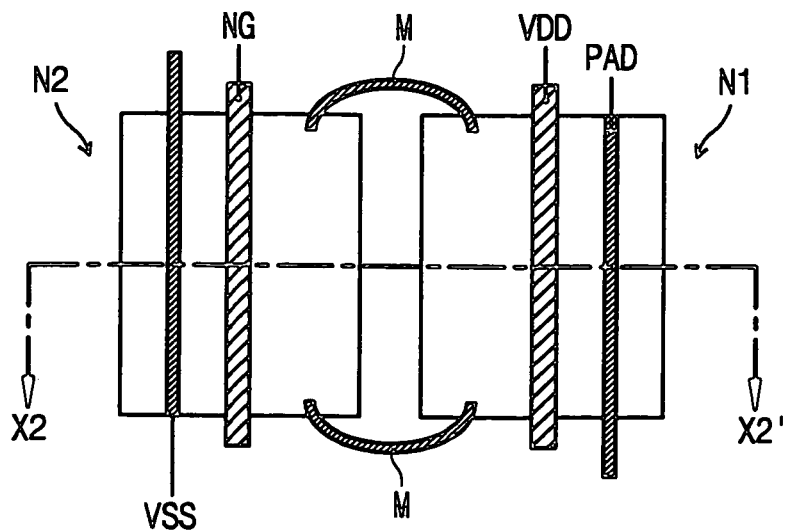
FIGS. 4B and 4C are planar and sectional views, respectively, of a configuration for the circuit of FIG. 4A.
Figure 4C:
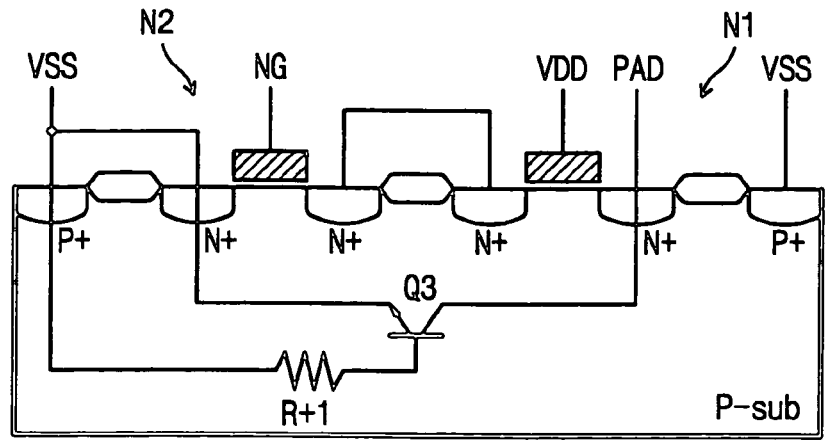
Figure 4D:
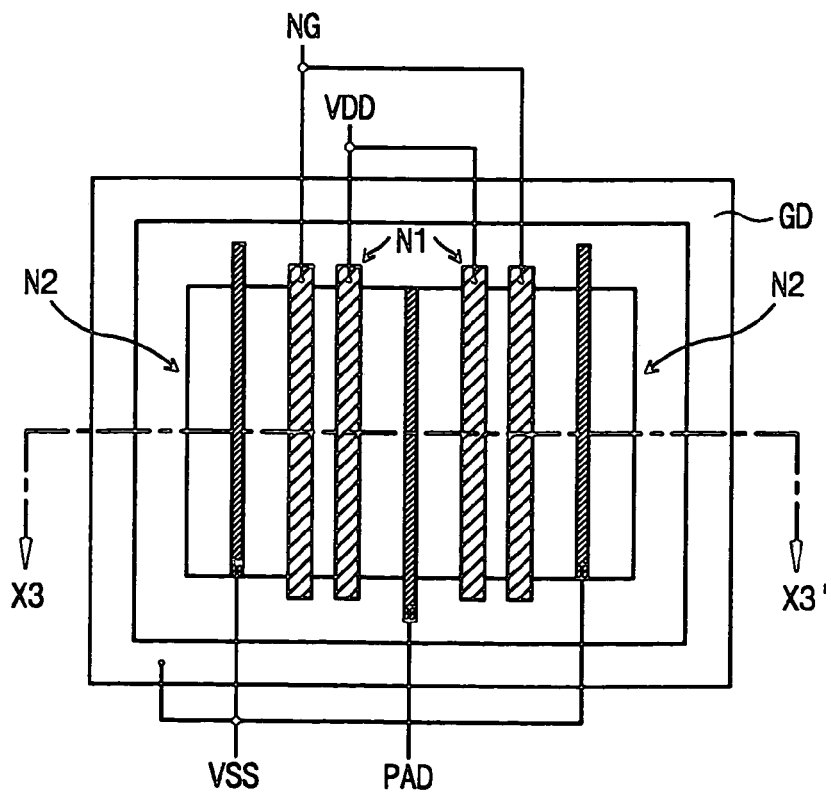
FIGS. 4D and 4E are planar and sectional views, respectively, of another configuration for the circuit of FIG. 4A.
Figure 4E:
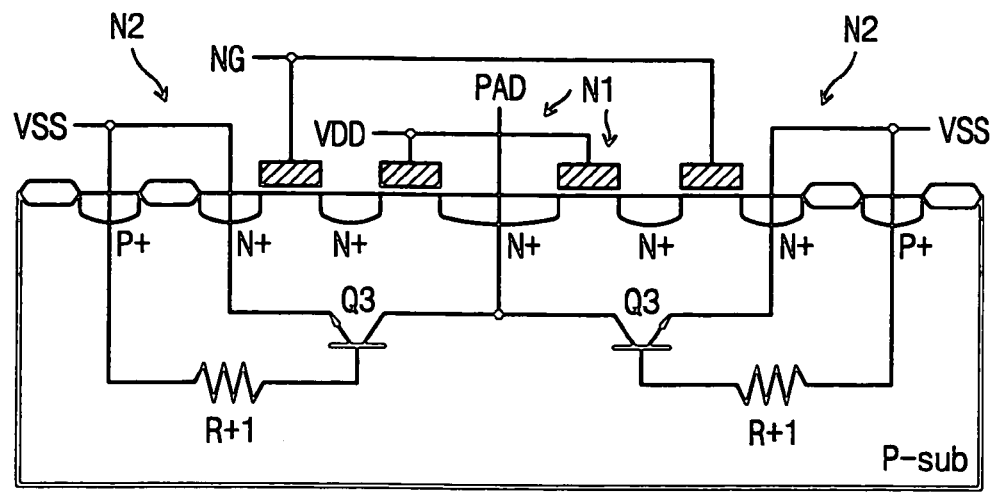
Figure 4F:
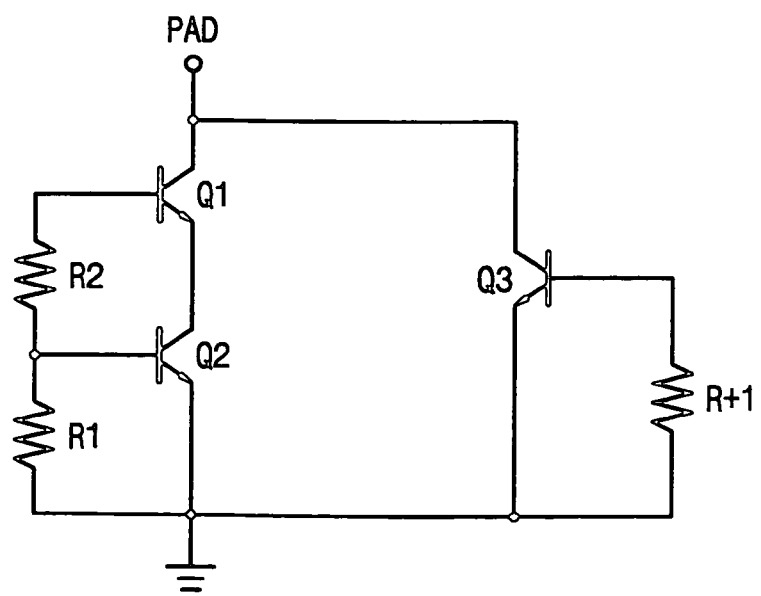
FIG. 4F is an equivalent circuit diagram showing parasitic bipolar transistors for the configurations of FIGS. 4B-4E.
Figure 5A:
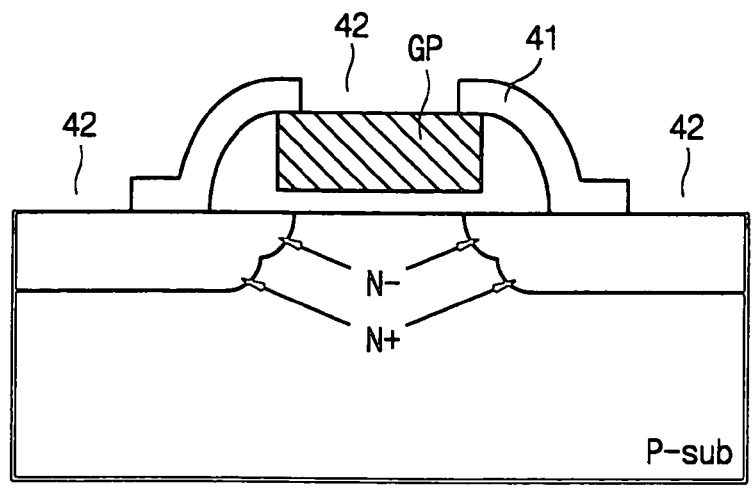
FIGS. 5A and 5B show operations for fabricating an NMOS transistor with a conventional partial salicidation process.
Figure 5B:
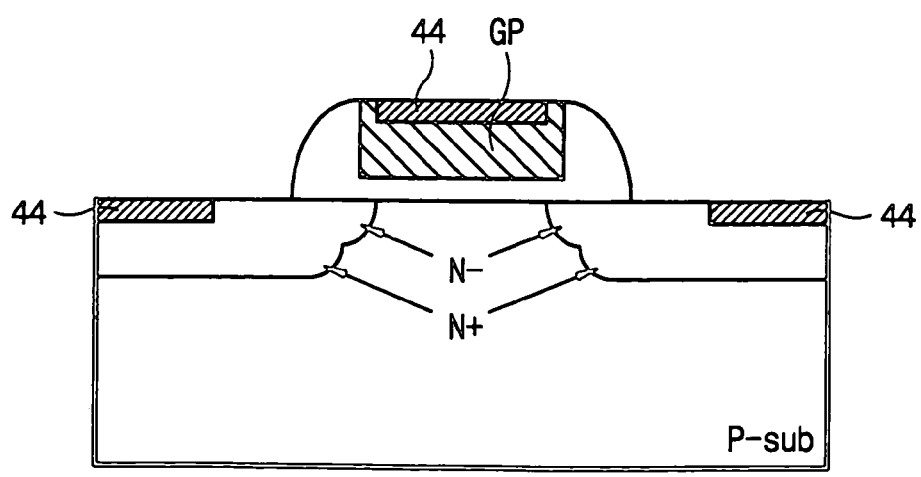
Figure 6A:
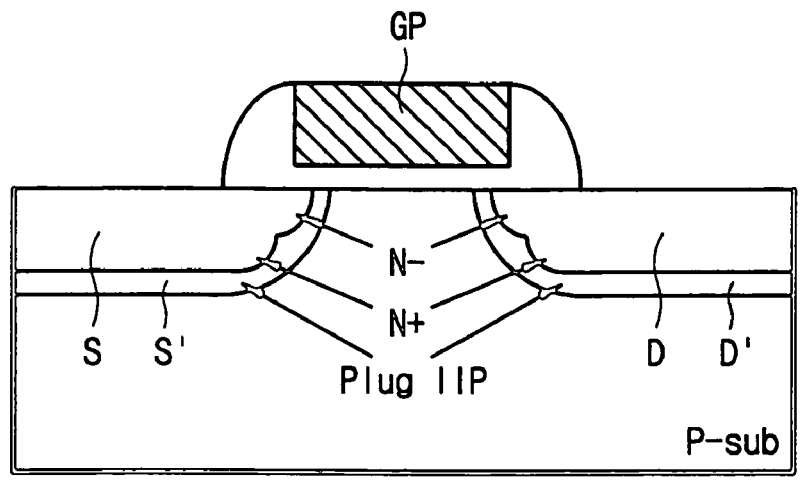
FIGS. 6A and 6B show operations for fabricating an NMOS transistor with a conventional ion implantation technique.
Figure 6B:
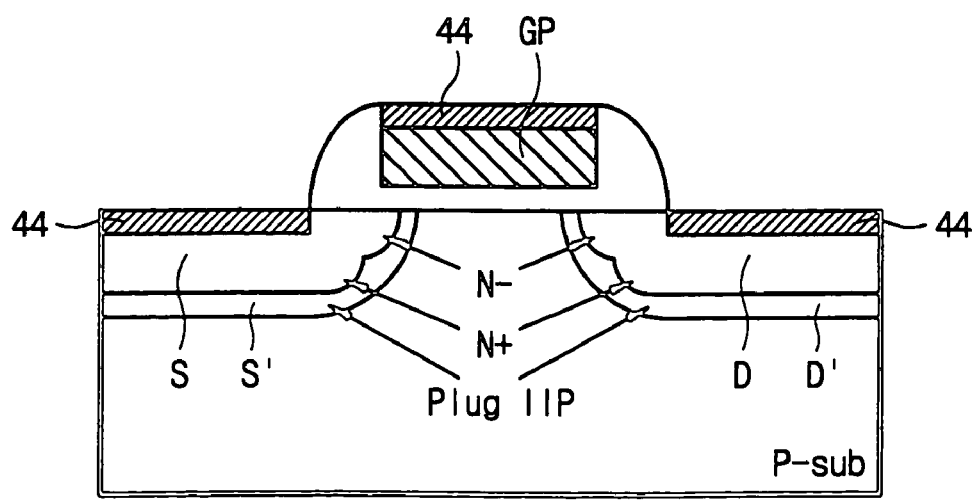
Figure 10:
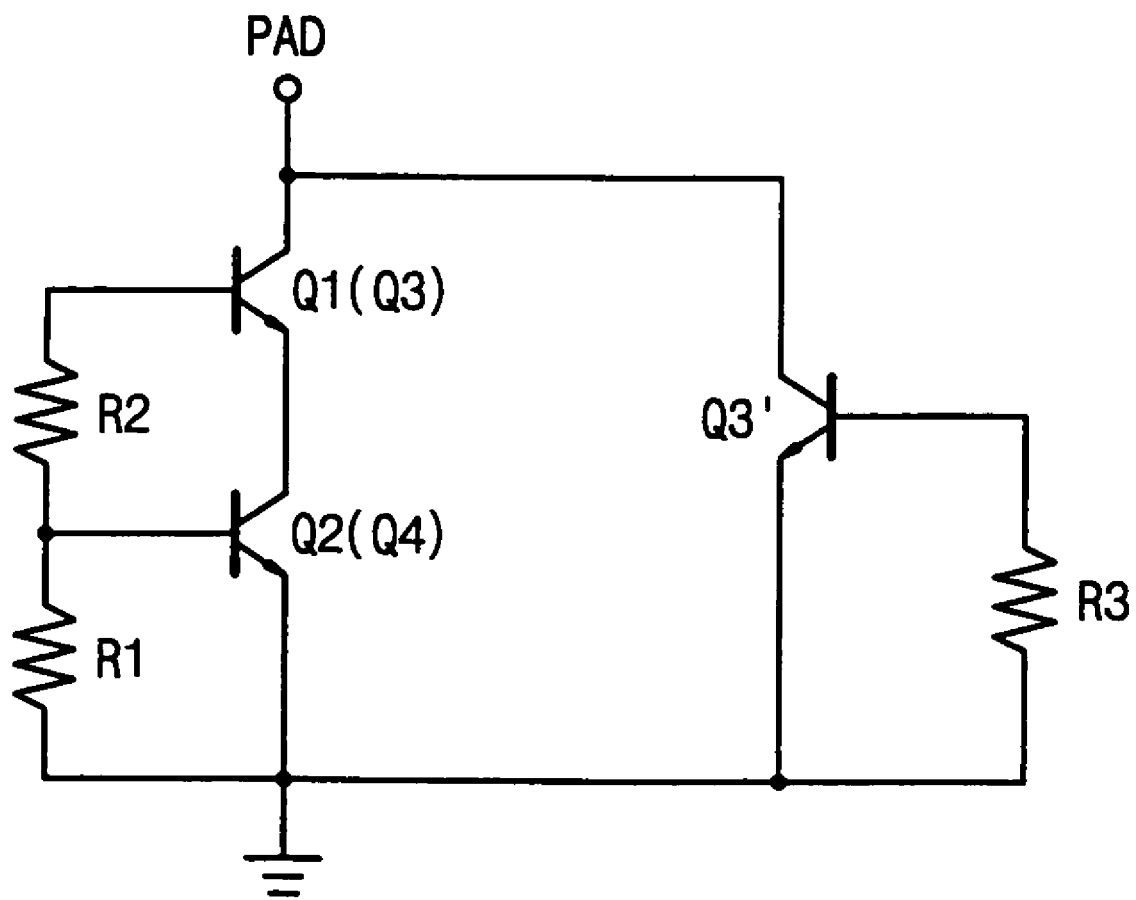
FIG. 10 is an equivalent circuit diagram of parasitic bipolar transistors present in the structure shown in FIGS. 7-9.

FIG. 10 shows an equivalent circuit for the structure of FIG. 9, including the parasitic transistors Q1, Q2 illustrated in FIG. 9, along with an additional parasitic bipolar transistor Q' that includes a collector and emitter coupled to the signal pad PAD and the power supply ground voltage node VSS, respectively. The gain the transistor Q' may be lower than that of the parasitic transistor Q3 shown in FIG. 4F, because the opposing faces of the drain regions, D1 and D2, connected to the external signal pad PAD, and the source regions, S4 and S5, connected to the power supply ground node VSS, can be made narrower than in the conventional configuration of FIGS. 4D-F. In contrast to the structure in FIG. 4D, the paths between these faces are angularly displaced from, i.e., not collinear with, the channels of the transistors N1, N2 (in the illustrated embodiment, the paths between these opposing faces are perpendicular to the channels of the transistors N1, N2). Interposing the P-type guard ring GD between the source and drain regions of the first and second transistors N1, N2 can further reduce the gain of the parasitic bipolar transistor Q'.

Operations for fabrication the circuit of FIGS. 8 and 9 will now be described. Referring to FIG. 9, a field oxide layer FOX is formed on the P-type substrate 900, defining the first and second active regions 71, 72. Next, a gate oxide film (not shown) is formed on the active regions 71, 72. A conductive material layer, e.g., a doped polycrystalline silicon layer, is then formed on the substrate 900, and then patterned to form the gate electrodes 73, 74, 75, 76 of the first transistor N1 and the gate electrodes 73', 74', 75', 76' of the second transistor N2.

N-type impurities are then implanted into the first and second active regions 71, 72 to form the source and drain regions, S1, S2, S3, S4, S5, D1, D2, D3, D4, D5, using the gate electrodes 73, 74, 75, 76, 73', 74', 75', 76' and the field oxide regions FOX as a mask. The guard ring GD may be formed in the substrate 900 around the first and second active regions 71, 72, by, for example, implanting P-type impurities into the substrate 900. After forming an inter-layer isolation film on the structure with the first and second transistors, N1 and N2, the conductors 77, 78, 79, 80, 81, 83, 83 are formed on the insulation films. The conductors 77, 78, 79, 80, 81, 83, 83 are electrically connected to the source and drain regions, S1, S2, S3, S4, S5 and D1, D2, D3, D4, D5 and the guard ring GD through contact holes penetrating the inter-layer isolation films.

Figure 11A:
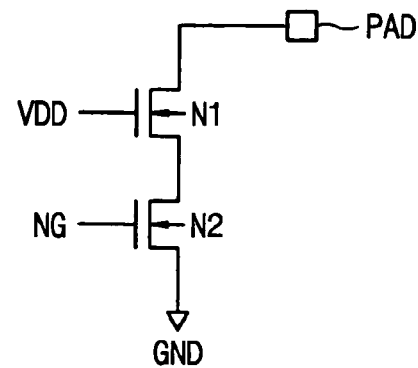
FIGS. 11A-11C and 12A-12C illustrate output circuits according to various embodiments of the present invention.
Figure 11B:
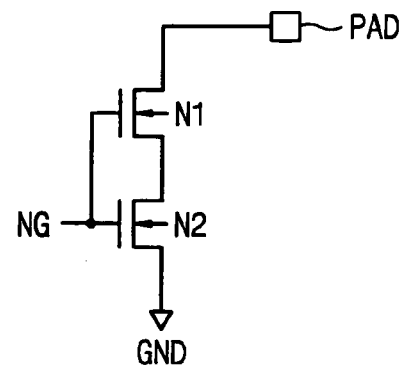
Figure 11C:
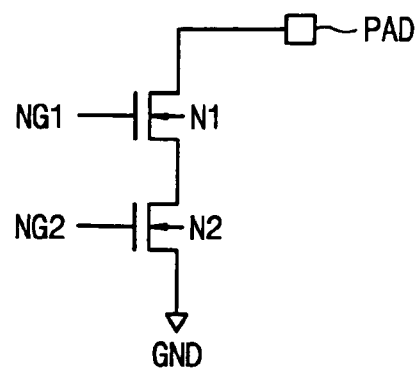

As shown in FIGS. 11A, 11B and 11C, the gate electrodes of the transistors N1, N2 may be connected in a number of different ways. For example, as an alternative to the connection shown in FIG. 11A, the gate electrodes of both transistors N1 can be coupled to the signal input node, as shown in FIG. 11B, or coupled to different signal input nodes NG1, NG2, as shown in FIG. 11C.

Figure 12A:
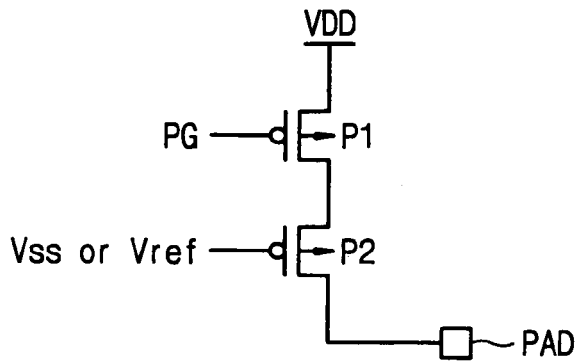
Figure 12B:
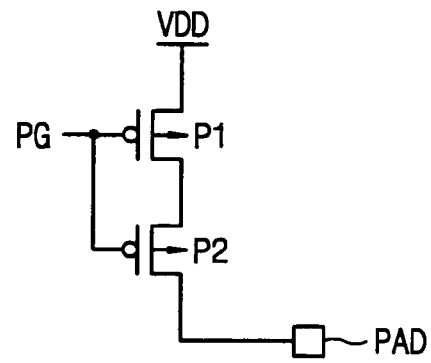
Figure 12C:
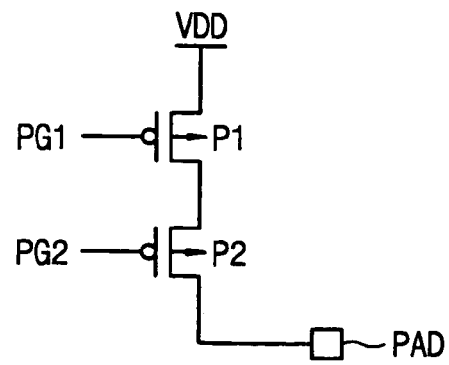

It will be appreciated that the present application is also applicable to providing ESD protection between an external signal pad PAD and a power supply voltage node VDD, as shown in FIGS. 12A, 12B and 12C. In these embodiments of the present invention, structures complementary to those in FIGS. 8 and 9 (in terms of conductivity type) may be used for PMOS transistors P1, P2. As shown in FIG. 12A, the gate electrode of the transistor P1 may be connected to an input signal node PG, with the gate electrode of the transistor P2 being connected to a power supply ground node VSS or a reference voltage node Vref. In other embodiments, gate electrodes of both transistors P1, P2 can be connected to an input signal node PG, as shown in FIG. 12B, or to separate input signal nodes PG1, PG2, as shown in FIG. 12C. It will be further understood that the present invention is also applicable to MOS transistors with gates formed by non-salicidation processes, as activation of a horizontal bipolar loop can be restrained by forming double-diffused sources and drains in an isolated diffusion region.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of fabricating an output circuit for an integrated circuit, the method comprising:
    forming an isolation region in a substrate, defining first and second active regions in the substrate;
    forming a first MOS transistor in the first active region;
    forming a second MOS transistor in the second active region, arranged such that a channel of the second MOS transistor is laterally displaced with respect to a channel of the first MOS transistor and not co-linear with the first MOS transistor;
    forming a first conductor on the substrate connecting a source region of the first MOS transistor to a power supply node of the integrated circuit;
    forming a second conductor on the substrate connecting a drain region of the first MOS transistor to a source region of the second MOS transistor; and
    forming a third conductor connecting a drain region of the second MOS transistor to an external signal pad of the integrated circuit device.

2. A method according to claim 1, wherein a surface of the source region of the first MOS transistor that faces the drain region of the second MOS transistor is smaller than a surface of the source region of the first MOS transistor that faces the drain region of the first MOS transistor.

3. A method according to claim 1, wherein the channels of the first and second MOS transistors are substantially parallel.

4. A method according to claim 1:
    wherein the first MOS transistor comprises:
    a plurality of source regions in the first active region;
    a plurality of drain regions in the first active region, a respective one of the drain regions of the first MOS transistor disposed between first and second ones of the source regions of the first MOS transistor; and
    a plurality of gate electrodes, respective ones of which are disposed between respective adjacent source and drain regions of the first MOS transistor; and
    wherein the second MOS transistor comprises:
    a plurality of source regions in the second active region;
    a plurality of drain regions in the second active region, a respective one of the drain regions of the second MOS transistor disposed between first and second ones of the source regions of the second MOS transistor; and
    a plurality of gate electrodes, respective ones of which are disposed between respective adjacent source and drain regions of the second MOS transistor.

5. A method according to claim 1, wherein the substrate has a first conductivity type, wherein the source and drain regions have a second conductivity type, and wherein forming an isolation region further comprises forming a guard region in the substrate having a higher degree of the first conductivity type than the substrate, disposed between the first and second active regions and connected to the power supply node.

6. A method according to claim 5, wherein forming an isolation region comprises forming a first insulating region surrounding the first active region and a second insulating region surrounding the second active region, wherein forming a guard region comprises forming a guard ring surrounding and separating the first and second insulating regions.

7. A method according to claim 1, wherein the power supply node is a power supply ground node or a power supply voltage node or a voltage reference node.

* * * * *